United States Patent [19]
Chung

[11] Patent Number: 5,747,817
[45] Date of Patent: May 5, 1998

[54] ONE-STEP METHOD FOR ON-LINE LITHOGRAPHIC PATTERN INSPECTION

[75] Inventor: Wen-Jye Chung, Hsin-chu, Taiwan

[73] Assignee: Taiwan Semiconductor Manufacturing Company, Ltd., Hsin-Chu, Taiwan

[21] Appl. No.: 709,899

[22] Filed: Sep. 9, 1996

[51] Int. Cl.$^6$ ........................................... G03F 7/20
[52] U.S. Cl. ................................. 250/492.2; 430/5
[58] Field of Search .............................. 250/492.2, 492.1, 250/505.1; 430/5; 355/71, 125

[56] References Cited

U.S. PATENT DOCUMENTS

| | | | |
|---|---|---|---|
| 4,088,896 | 5/1978 | Elkins et al. | 250/492.2 |
| 4,788,117 | 11/1988 | Cothbert et al. | 430/30 |
| 4,902,899 | 2/1990 | Lin et al. | 250/492.2 |

Primary Examiner—Kiet T. Nguyen
Attorney, Agent, or Firm—George O. Saile; Stephen B. Ackerman

[57] ABSTRACT

In conjunction with the standard step and repeat process, photocleaving of certain features is achieved by adding to the photoresist mask a photocleaving structure located on the opposite side from the features. The photocleaving structure consists of an opaque area and an attenuating area, separated by a straight line boundary. The attenuating area reduces the amount of actinic radiation that can passes through it by one of several possible elements including alternating opaque and transparent areas that are too small and too closely spaced to be resolved by the radiation. Using an unmodified step and repeat procedure, the latent image of the features that are to be photocleaved is first formed in the usual way (exposure through the mask). When the mask is positioned for the next exposure, the afore-mentioned boundary in the photocleaving structure is arranged to exactly bisect the features so that, after the second exposure, the features will have been photocleaved.

8 Claims, 4 Drawing Sheets

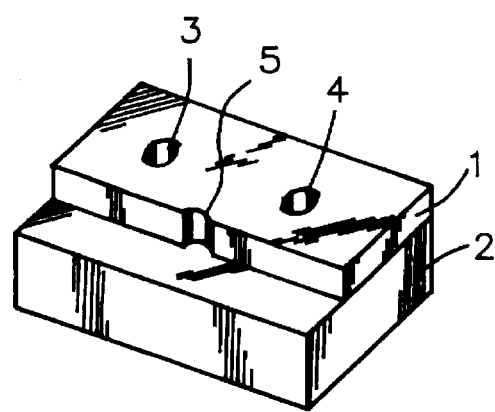
FIG. 1 – Prior Art
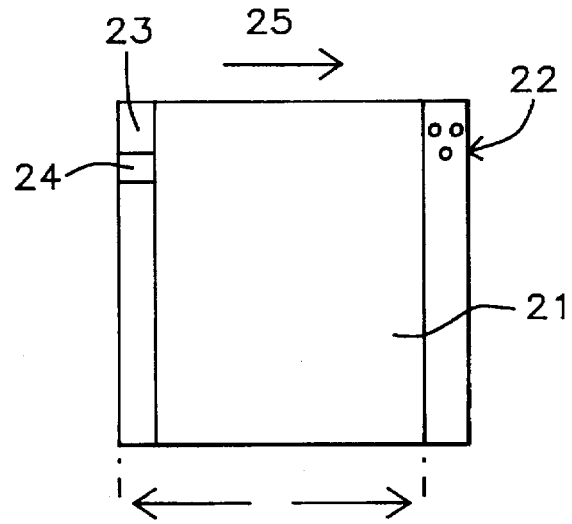
FIG. 2
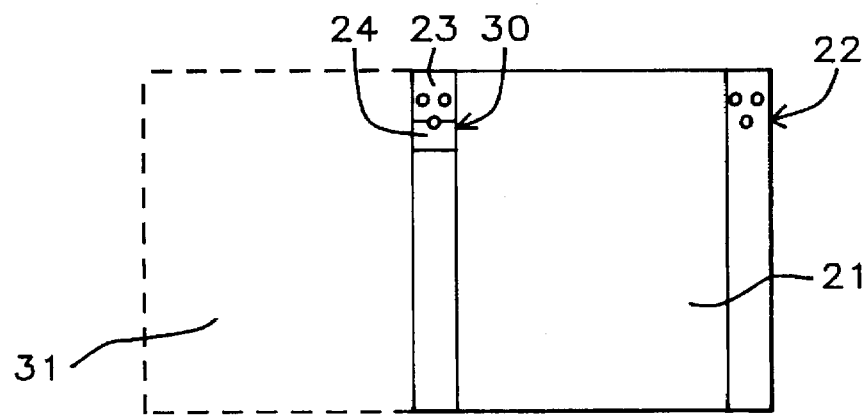
FIG. 3

ONE-STEP METHOD FOR ON-LINE LITHOGRAPHIC PATTERN INSPECTION

BACKGROUND OF THE INVENTION

(1) Field of the Invention

The invention relates to the general field of photolithography, more particularly to on-line inspection of photolithographic patterns in integrated circuits.

(2) Description of the Prior Art

Photolithography has been routinely used in the semiconductor industry for many years. As circuits grow ever more dense, finer and finer lines are used to form devices and interconnections. As the resolution limit of the actinic radiation that is used to expose the photoresist is approached, the probabilty that not all lines, holes, etc. will be perfectly formed increases. Thus, inspection of the developed photoresist, particularly the first time a given pattern and/or set of exposure conditions are used, plays an increasingly important role.

Inspection of the developed photoresist may be by optical means or higher resolution techniques, such as scanning electron microscopy, may be used. In general, simply viewing the photoresist image will not be sufficient. In features, such as lines or holes, defects in the resist image can only be seen by first cross-sectioning the feature.

A convenient method for cross-sectioning a photoresist feature, called photocleaving, has been described by Cuthbert et al. (U.S. Pat. No. 4,788,117 Nov 1988). The method, which is intended for use with positive photoresists, involves a two step process. First, the photoresist is exposed to actinic radiation through a mask that includes the feature in question. A normal exposure is used — that is, the radiation dose is sufficient to make quite sure that exposed portions of the resist will be washed away during development.

A second mask, containing a clear area and an opaque area, separated by a straight line boundary, is then aligned so that this boundary bisects the feature and the resist is given a second exposure. Cuthbert et al. state that the second exposure should preferably be less than normal — barely sufficient to ensure the subsequent removal of exposed material.

Once the resist is developed, half the feature will have been removed and half will be intact, thereby providing a cross-sectioned feature. An example of a cross-section obtained by photocleaving is illustrated in FIG. 1. Exposed and developed layer of photoresist 1 is seen on top of substrate 2. Layer 1 includes three features, holes 3 and 4 which have their normal appearance and hole 5 which has been photocleaved. As explained by Cuthbert et al., when the wavelength of the actinic radiation is close to the dimensions of the feature to be cross-sectioned, a good cross-section will not be obtained by simply including a bisected feature in the original mask. Any sharp points in such a feature will be rounded because of the resolution limitation, whereas this does not occur if the photocleaving method just described is used.

Particularly when used in a production environment, the photocleaving method of Cuthbert et al, suffers from several limitations. In particular, two masks, two alignment steps, and two different exposures to the actinic radiation are needed. The present invention teaches a method for achieving photocleaving of quality comparable to that achieved by the method of Cuthbert et al. but requires only a single mask, a single alignment, and a single exposure.

SUMMARY OF THE INVENTION

It has been an object of the present invention to provide a one-step method for the on-line inspection of photoresist patterns of the type used in the manufacture of semiconductor circuits.

Another object of the present invention is that said on-line inspection method should not require any modification of the standard step and repeat method currently in use for the formation of multiple photoresist patterns.

A still further object of the present invention is that said on-line inspection method should not require any significant modification of, or additonal cost for, the masks through which the photoresist is exposed.

Yet another object of the present invention is that it result in the effective photocleaving of specific mask features.

These objects have been achieved by adding to the photoresist mask a photocleaving structure located on the opposite side from the features that are to be photocleaved. The photocleaving structure comprises an opaque area and an attenuating area, separated by a straight line boundary. The attenuating area reduces the amount of actinic radiation that can pass through it by means of alternating clear and transparent areas that are too small and too closely spaced to be resolved by the radiation. Using standard step and repeat procedures, the latent image of the features that are to be photocleaved are first formed in the usual way (exposure through the mask). When the mask is positioned for the next exposure, the afore-mentioned boundary in the photocleaving structure is arranged to exactly bisect the features so that, after the second exposure, the feature will have been photocleaved.

BRIEF DESCRIPTION OF THE DRAWINGS

FIG. 1 shows the appearance of a single feature (a hole) that has been photocleaved.

FIG. 2 shows a circuit mask, including a feature that is to be photocleaved, together with the photocleaving structure that is taught by the present invention.

FIGS. 3 and 4 show the latent images and photocleaved images resulting from two successive shifts of, and exposures through, the circuits and features mask.

DESCRIPTION OF THE PREFERRED EMBODIMENTS

To explain the method of the present invention we need to first describe our photocleaving structure. This is a region, within a 'normal' photoresist mask, consisting of an opaque area and an attenuating area with a straight line boundary between the two areas. The amount of attenuation needed varies on a case by case basis but the percentage of actinic radiation transmitted by the attenuating area will generally be in the range between about 10 and 50%.

In principle, the attenuating area could be formed from a semi-transparent metal layer. Such layers are commonly used in optical beam splitters. In practice, however, the masks used for photolithography in integrated circuits are made from relatively thick layers of chromium or similar metal. To make part of such a mask semi-transparent would be time consuming and expensive. Accordingly, we have used a subresolution pattern to achieve the same result.

A sub-resolution pattern consists of a set of fully opaque and fully transparent areas of a size and separation that is below the resolution limit of the radiation that is to pass through it. Thus, a certain fraction of the incident radiation passes through the transparent areas and the rest is blocked. Since the wavelength of the radiation (which varies from case to case but generally falls in the range between about 3,000 and 5,000 Angstroms) is too long to resolve the different areas, all that emerges is an attenuated beam.

A sub-resolution pattern that we have found convenient to use is a set of parallel stripes. The width of and separation between the stripes is chosen to be less than the wavelength of the actinic radiation being used in the particular case.

Figure 5A:
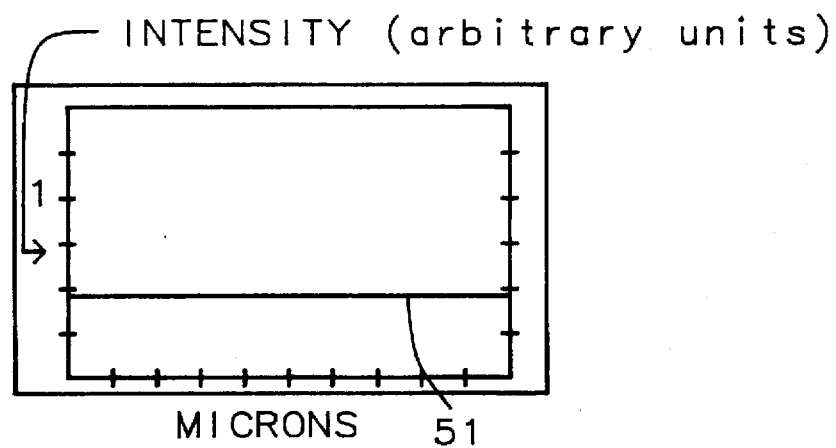
FIG. 5a through 5c show three curves of relative intensity vs. distance for three different line widths and line separations in a sub-resolution attenuating mask.
Figure 5B:
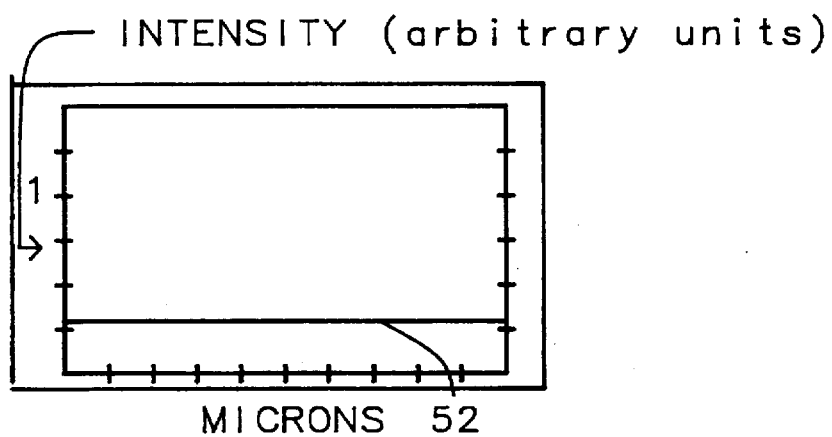
Figure 5C:
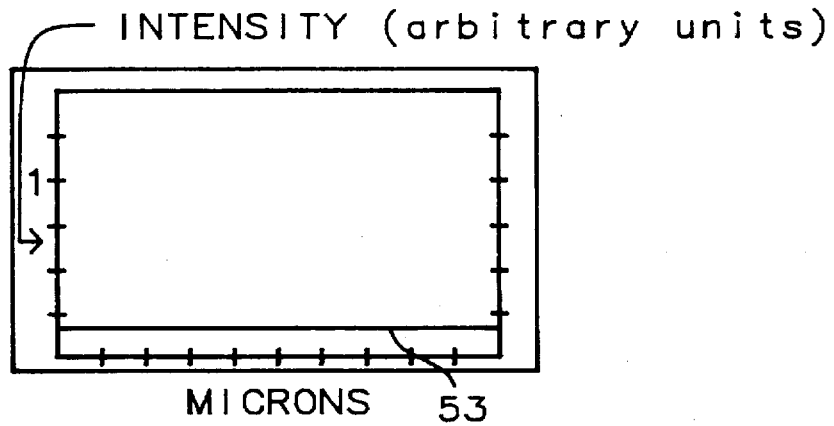

In FIGS. 5a through 5c we show some data relating to sub-resolution patterns formed from parallel stripes. The relative intensity of the transmitted beam is shown as a function of position beneath the pattern for three different stripe width/spacing combinations. In all cases a beam of uniform intensity was obtained. In FIG. 5a the stripes were 0.1 microns wide separated by 0.2 microns and the transmitted beam was attenuated to 50%, as seen in curve 51. In FIG. 5b the stripes were 0.15 microns wide separated by 0.15 microns and the transmitted beam was attenuated to 25%, as seen in curve 52. In FIG. 5c the stripes were 0.2 microns wide separated by 0.1 microns and the transmitted beam was attenuated to 12.5%, as seen in curve 53.

The method of the present invention for the on-line inspection of a photolithographic pattern can now be described. An example of the type of mask that is used is shown in FIG. 2. The major part of the mask 21 contains circuit features of the usual sort. Shown separately, is feature 22 that is to be photocleaved according to the method of the present invention. In FIG. 2 this is shown as being outside the main circuit pattern. This is so that it will end up being located in the kerf between the circuit patterns. This is a preferred location for these features but it is also possible to locate them inside as part of the main circuit pattern.

On the opposite side of the mask is the photocleaving structure, made up of the opaque area 23 and the attenuating area 24, with a straight line boundary running between these two areas. "As noted earlier, attenuating area 24, as shown in FIGS. 2 and 3, could be formed from a semi-transparent layer.". Note that the boundary is positioned so when it is translated in the direction of arrow 25, it exactly bisects the feature 22. Note also that though we show feature 22 as a circular hole, any feature such as a line segment, a rectangular hole, etc. could equally well have been used.

We can now proceed to describe the method itself. First, a suitable substrate is coated with a layer of a positive photoresist in the usual way. A mask similar to the one shown in FIG. 2, containing the appropriate circuit patterns and being smaller in area than the substrate, is positioned in one corner of the substrate and the layer of photoresist under it is exposed to actinic radiation, directed through the mask, so that, referring to FIG. 3, a latent image 31 of the circuit pattern, is formed as well as latent image 30 of the feature.

Next, the mask is moved to the right (direction 25 in FIG. 2), relative to the substrate, so that the straight line boundary between attenuating region 24 and opaqu region 23 exactly bisects the latent image 30 of the feature. The photoresist layer directly under mask 21, in its new position, is once again given a normal dose of the actinic radiation (directed through the mask). In this way latent images of feature 22 and circuit pattern 21 (in their new position seen FIG. 3) are formed as before.

Figure 4:
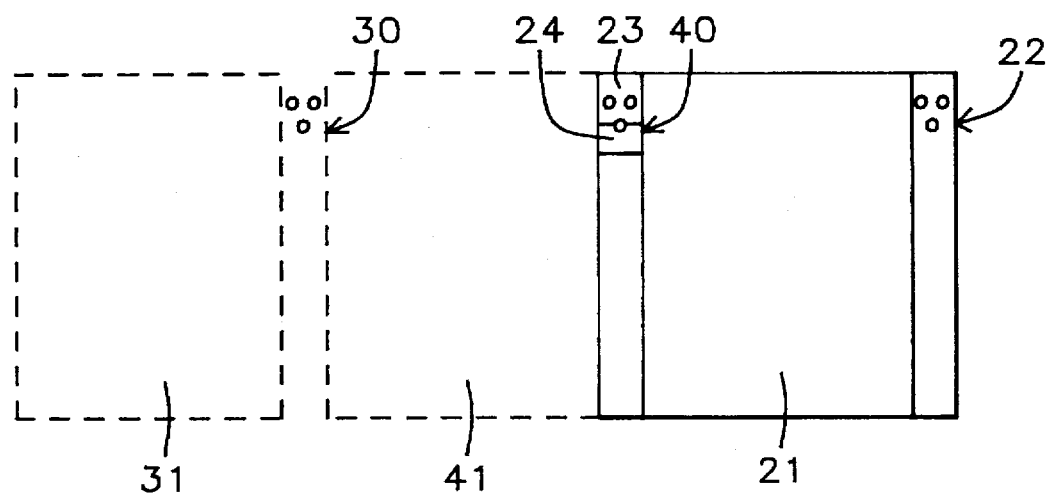

At the same time that these latent images are formed, latent image 30 of the feature (formed during the preceding exposure) is photocleaved. Now mask 21 is moved to the right (direction 25) again so the appearannce is as seen in FIG. 4. There are now two latent images, 31 and 41, of the circuit pattern, a newly formed latent image 40 of the feature, and photocleaved latent image 30. The procedure of exposing and then moving the mask relative to the substrate is repeated until an edge, or similar limiting feature, of the wafer is reached. The mask is then moved in a direction perpendicular to direction 25 until it is covering only unexposed resist and the step and repeat procedure is resumed. In practice, stepping and repeating would be repeated multiple times.

Figure 6:
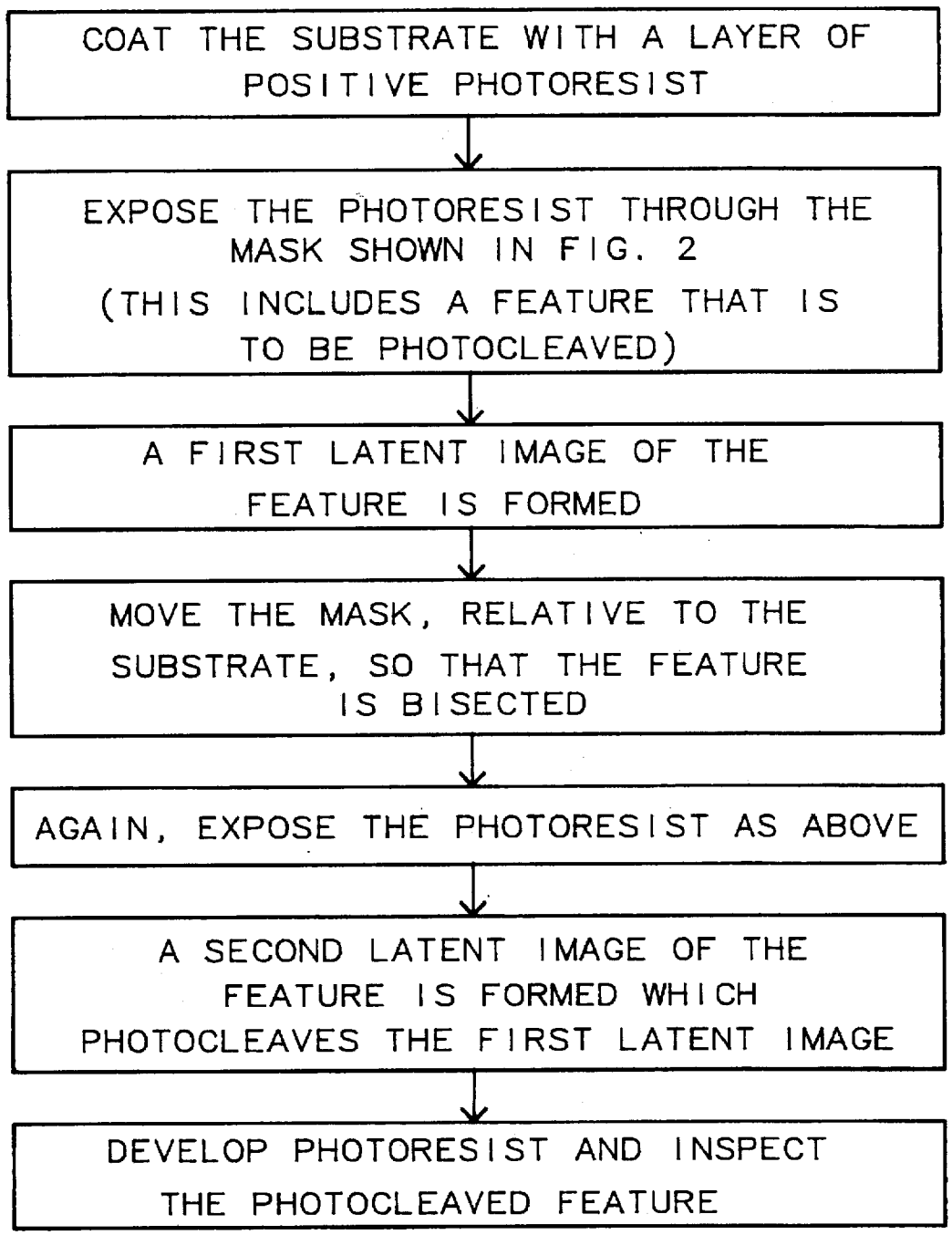
FIG. 6 is a flow chart showing the method of the present invention.

A key result of the procedure that we have just described is that all but the last pattern that was exposed will be accompanied by a photocleaved feature that is located nearby. The method allows this to be achieved with no modification to the normal (no photocleaving) procedure and at no extra cost. As already mentioned, once the photoresist layer has been developed, the photocleaved features can be examined by any suitable means, including optical microscopy and scanning electron microscopy. "The process that we have just described is summarised in flow chart form in FIG. 6".

While the invention has been particularly shown and described with reference to the preferred embodiments thereof, it will be understood by those skilled in the art that various changes in form and details may be made without departing from the spirit and scope of the invention.

What is claimed is:

1. A photocleaving structure, located within a photoresist mask, comprising:

an opaque area;

an attenuating area, comprising a uniform layer of semi-transparent material, that transmits a percentage of actinic radiation directed through it; and a straight line boundary between the opaque and attenuating areas.

2. A method for the on-line inspection of a photolithographic pattern comprising the steps of:

(a) coating a substrate with a layer of a positive photoresist;

(b) providing a mask containing circuit patterns, smaller in area than the substrate, and having two parallel edges;

(c) including in said mask a feature located at one of said edges;

(d) including in said mask a photocleaving structure, located at the other edge and containing an opaque area, an attenuating area, and a boundary between said opaque and attentuating areas;

(e) exposing the photoresist to a normal dose of actinic radiation, directed through the mask, thereby forming a first latent image of the feature;

(f) moving the mask, relative to the substrate, in a direction and by an amount such that said boundary bisects the feature;

(g) exposing the photoresist to said normal dose of actinic radiation, directed through the mask, thereby forming a second latent image of the feature and photocleaving the first latent image;

(h) developing the photoresist; and (i) inspecting the photocleaved feature.

3. The method of claim 2 further comprising the steps of performing steps (e) through (g) multiple times.

4. The method of claim 2 wherein the photocleaved feature is located between said circuit patterns.

5. The method of claim 2 wherein the photocleaved feature is located within the circuit patterns.

6. The method of claim 2 wherein the wavelength of the actinic radiation is between about 3,000 and 5,000 Angstroms.

7. The method of claim 2 wherein step (i) further comprises an optical inspection.

8. The method of claim 2 wherein step (i) further comprises means of scanning electron microscopy.

* * * * *